US012663460B2

(12) United States Patent
Jeong et al.

(10) Patent No.: US 12,663,460 B2
(45) Date of Patent: Jun. 23, 2026

(54) APPARATUS FOR TESTING ELECTRONIC DEVICES

(71) Applicant: JCET STATS ChipPAC Korea Limited

(72) Inventors: SeungHyeon Jeong, Chuncheon (KR); HunTaek Lee, Gyeonggi-do (KR); BumSoo Park, Seoul (KR); JiSu Lee, Incheon (KR)

( * ) Notice: Subject to any disclaimer, the term of this patent is extended or adjusted under 35 U.S.C. 154(b) by 175 days.

(21) Appl. No.: 18/780,499

(22) Filed: Jul. 23, 2024

(65) Prior Publication Data

US 2025/0035698 A1     Jan. 30, 2025

(30) Foreign Application Priority Data

Jul. 25, 2023     (CN) .......................... 202310916599.2

(51) Int. Cl.
*G01R 31/28*     (2006.01)
*H05K 9/00*     (2006.01)

(52) U.S. Cl.
CPC ..... *G01R 31/2862* (2013.01); *G01R 31/2884* (2013.01); *H05K 9/0088* (2013.01)

(58) Field of Classification Search
CPC ....................... G01R 31/2862; G01R 31/2884; G01R 31/00; G01R 1/02; G01R 1/04; G01R 1/0416; G01R 31/2889; G01R 1/0466; G01R 31/2863; H05K 9/0088; H01Q 17/00
See application file for complete search history.

(56) References Cited

U.S. PATENT DOCUMENTS

| | | | |
|---|---|---|---|
| 6,717,485 B2 | 4/2004 | Kolb et al. | |
| 7,919,972 B2 * | 4/2011 | Kurita ................ | G01R 31/2893 |
| | | | 324/754.21 |
| 8,208,273 B1 | 6/2012 | Alcala et al. | |
| 11,079,429 B2 | 8/2021 | Zanati et al. | |
| 11,604,211 B1 | 3/2023 | Chiu et al. | |
| 2008/0116918 A1 | 5/2008 | Kanev et al. | |
| 2009/0195262 A1 * | 8/2009 | Abboud .............. | H10P 72/3306 |
| | | | 324/754.22 |

(Continued)

FOREIGN PATENT DOCUMENTS

| | | |
|---|---|---|
| CN | 112821953 A | 5/2021 |
| WO | 2018/169206 A1 | 9/2018 |

*Primary Examiner* — Alvaro E Fortich
(74) *Attorney, Agent, or Firm* — Junhe Law Office, P.C.; Yi Zhang

(57)     ABSTRACT

An apparatus for testing electronic devices comprises: a base platform; a cover plate disposed on the base platform, and defining with the base platform an array of test chambers and at least one gap separating the test chambers from each other, wherein the cover plate has at each of the test chambers a top opening for placing an electronic device within the test chamber and a side wall around the opening; an array of test boards each being disposed under one of the array of test chambers, wherein each test board includes a socket connectable with the electronic device placed within the test chamber for testing; and an electromagnetic absorber material disposed within the at least one gap and attached onto the cover plate to absorb electromagnetic interferences between adjacent electronic devices when they are placed within the array of test chambers for testing.

9 Claims, 3 Drawing Sheets

(56)　　　　　　References Cited

U.S. PATENT DOCUMENTS

| 2011/0291683 | A1* | 12/2011 | Mueller | ................. H10P 72/72 |
| | | | | 324/754.08 |
| 2017/0018655 | A1* | 1/2017 | Okazaki | ............. H10D 30/6757 |
| 2019/0068300 | A1* | 2/2019 | Lu | ...................... G01R 31/3025 |
| 2023/0083634 | A1 | 3/2023 | Ranganathan et al. | |

* cited by examiner

APPARATUS FOR TESTING ELECTRONIC DEVICES

TECHNICAL FIELD

The present application generally relates to electronics testing technology, and more particularly, to an apparatus for testing electronic devices.

BACKGROUND OF THE INVENTION

Ultra-wideband (UWB) devices which utilize high-frequency (e.g., 5 to 9 GHz) electromagnetic waves as means of communication are widely used. In order to test the performance and quality of the UWB devices, test boards are provided to apply test signals to and receive results from the UWB devices connected to the test boards. Generally, multiple UWB devices are placed in a single test apparatus to allow for parallel testing. However, it is noted that interferences may occur between adjacent UWB devices, thereby lowering the accuracy of the test results.

Therefore, a need exists for further improvement to the existing test apparatus.

SUMMARY OF THE INVENTION

An objective of the present application is to provide an apparatus for testing electronic devices with reduced interferences between devices under test.

According to an aspect of the present application, an apparatus for testing electronic devices is disclosed. The apparatus comprises: a base platform; a cover plate disposed on the base platform, and defining with the base platform an array of test chambers and at least one gap separating the test chambers from each other, wherein the cover plate has at each of the plurality of test chambers a top opening for placing an electronic device within the test chamber and a side wall around the opening for separating the test chamber from the at least one gap; an array of test boards each being disposed under one of the array of test chambers, wherein each test board includes a socket connectable with the electronic device placed within the test chamber for testing; and an electromagnetic absorber material disposed within the at least one gap and attached onto the cover plate to absorb electromagnetic interferences between adjacent electronic devices when they are placed within the array of test chambers for testing.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain the principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
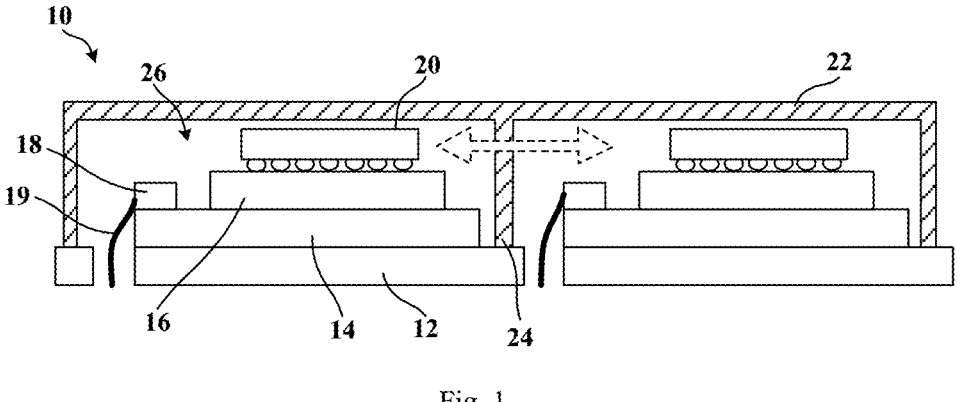
FIG. 1 illustrates a conventional apparatus for testing electronic devices.

FIG. 1 illustrates a conventional apparatus 10 for testing electronic devices. In some embodiments, the test apparatus 10 may be used to perform electrical performance tests on wireless devices or other similar devices.

As shown in FIG. 1, the test apparatus 10 includes a base platform 12 where a plurality of test boards 14 are placed. Each test board 14 may be a printed circuit board or other similar substrate that has a socket 16 and a connector 18. The socket 16 is used to connect an electronic device 20 under test (DUT), while the connector 18 is connected to a host device (not shown) such as a controller, a tester, a personal computer, a server, etc. through a wire or cable 19. The socket 16 and the connector 18 are electrically coupled with each other through the test board 14 (e.g., wiring, traces, or similar conductive structures in the test board 14), so that test signals can be applied to the electronic device 20 from the host device and test results can be received from the electronic device 20 to the host device.

Furthermore, a cover plate 22 is placed over the base platform 12 to prevent electromagnetic interferences between two adjacent electronic devices 20 and from the external space. However, it is found by the inventors of the present application that the interferences between two adjacent electronic devices 20 are still significant even there is a side wall 24 separating test chambers 26 where they are located. The inventors further identified that the interferences are caused from the strong penetrating power of parasite wireless signals radiated by the electronic devices 20, which cannot be effectively eliminated or reduced by the side wall 24. In order to address the above problem, there is provided a test apparatus with better electromagnetic insulation between adjacent test chambers of the test apparatus. Furthermore, the electromagnetic insulation may be implemented using electromagnetic wave absorber tapes that can be filled between the adjacent test chambers, which is simple but effective.

Figure 2:
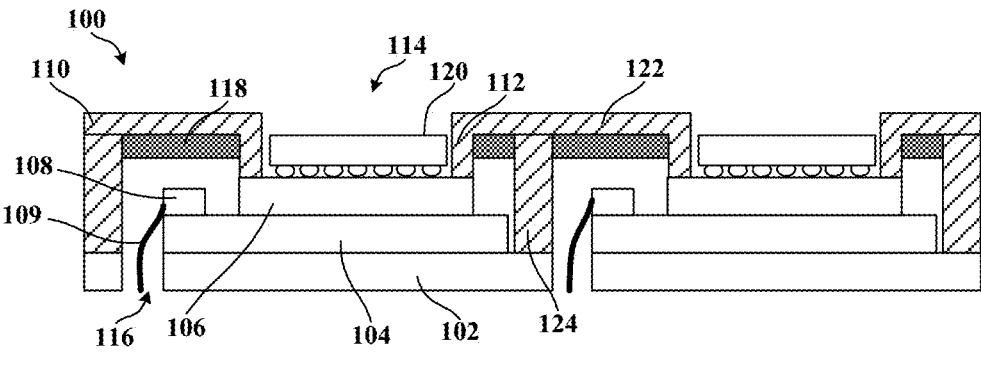
FIG. 2 illustrates an apparatus for testing electronic devices according to an embodiment of the present application.

FIG. 2 illustrates an apparatus 100 for testing electronic devices according to an embodiment of the present application.

As shown in FIG. 2, the test apparatus 100 includes a base platform 102 where other components of the test apparatus 100 are placed. For example, a plurality of test boards 104 can be placed on the base platform 102. The test boards 104 may be connected with each other so that they can be placed on the base platform 102 as a whole. However, to allow for the wiring of the test boards 104 to a host device (not shown), respective openings may be formed through the base platform 102 and between the adjacent test boards 104.

Each test board 104 may be a printed circuit board or other similar substrate that has a socket 106 and a connector 108. The socket 106 is connectable with an electronic device 120 under test (DUT), while the connector 108 is connected to the host device (not shown) such as a controller, a tester, a personal computer, a server, etc. through a wire or cable 109. The socket 106 and the connector 108 are electrically coupled with each other through the test board 104, so that test signals can be applied to the electronic device 120 from the host device and test results can be received from the electronic device 120 to the host device.

The test apparatus 100 further includes a cover plate 110. The cover plate 110 may be made of metal or other similar conductive materials. The cover plate 110 can be disposed on the base platform 102, such that it can define with the base platform 102 an array of test chambers 114. Each of the test chambers 114 is for receiving an electronic device 120 and is above a test board 104. The test chambers 114 may be separated from each other by at least one gap 116. In the embodiment, multiple gaps 116 are formed by the cover plate 110 and the base platform 102. The gaps 116 provide spaces for accommodating certain components of the test apparatus 100. For example, a portion of the test board 104 and the connector 108 and the wire 109 attached thereon can be accommodated in the gap 116. Furthermore, the gaps 116 can be connected to respective openings of the base platform 102 such that the wires 109 can extend from the connector 108 to the host device through the gap 116 and the opening. In some embodiments, the gaps 116 of the cover plate 110 may be connected together. In some other embodiments, the gaps 116 may be separated from each other, for example, by additional support walls that extend between the cover plate 110 and the base platform 102.

The cover plate 110 has at each of the plurality of test chambers 114 a top opening, through which an electronic device 120 can be placed within the test chamber. For example, the cover plate 110 may have a main frame 122 which is topmost of the cover plate 110. The main frame 122 may define the top openings of the cover plate 110. It can be appreciated that the top opening should have a size greater than that of the electronic device 120 under test, to facilitate the placement and displacement of the electronic device 120. Since these openings provide access to the test boards for electronic devices under test, the cover plate 110 can be fixed to the base platform through fasteners, threads or similar means, instead of being removably supported on the base platform 102.

Furthermore, the cover plate 110 may have side walls 112 around the top opening to separate the test chambers 114 from the adjacent gaps. As mentioned above, the gaps 116 provide spaces between adjacent test chambers 114 so that additional interference eliminating means may be deployed in the gaps 116. In particular, an electromagnetic absorber material 118 may be disposed within the gaps 116 and attached onto the cover plate 110 to absorb electromagnetic interferences between adjacent electronic devices when they are placed within the test chambers 114 for testing. In some embodiments, the electromagnetic absorber material 118 may be attached onto the bottom surface of the main frame 122, as shown in the embodiment of FIG. 1. In some alternative embodiments, the electromagnetic absorber material 118 may be attached onto an inner surface of the side walls 112, or onto both the main frame 122 and the side walls 112.

In some embodiments, the electromagnetic absorber material 118 may be in the form of tapes, which can be easily attached onto the cover plate 110. For example, the electromagnetic absorber material 118 may be a laminate of metal, electromagnetic absorber and adhesive layers. The adhesive layer can be used for the attachment of the electromagnetic absorber material 118, while the metal and electromagnetic absorber layers can function as layers to prohibit the penetration of electromagnetic waves between two adjacent test chambers. In an example, the electromagnetic absorber material 118 may be W-Absorber which is commercially available from Withwave. W-Absorber is a microwave absorber in a thin sheet format made of a mixture of polymer resin and metal magnetic powder, which can suppress electromagnetic noises from electronic devices for wideband microwave frequency range and reduce surface current as well as surface reflection in cavity resonant applications. However, it can be appreciated that any other suitable materials may be used.

It can be appreciated that the electromagnetic absorber material 118 is not disposed in the test chambers 114, for example, not onto an outer surface of the side wall 114 (the outer surface is a surface of the side wall 114 close to the DUT in the embodiment). Since the test chambers 114 are used to accommodate different electronic devices and the electromagnetic absorber material 118 is generally soft, it may be easily worn out if placed in the test chambers 114 rather than filled in the gaps 116.

Figure 3:
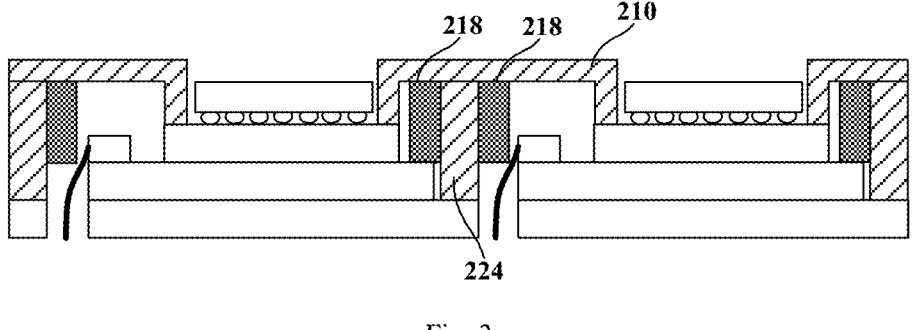
FIG. 3 illustrates an apparatus for testing electronic devices according to an alternative embodiment of the present application.

In some embodiments, the cover plate 110 may include at least one support wall 124 in the gaps 116. For example, each support wall 124 may be disposed between two adjacent test chambers 114. The support wall 124 may extend between the main frame 122 and the base platform 102 to, along with the side walls 112, support the cover plate 110 on the base platform 102. The support wall 124 provides additional structures between test chambers 114 where the electromagnetic absorber material can be attached. As shown in FIG. 3 which is an alternative embodiment of the present application, two pieces of electromagnetic absorber materials 218 are attached onto both sides of a support wall 224 of the cover plate 210. The electromagnetic absorber materials 218 can better suppress electromagnetic interferences between adjacent electronic devices because the vertically extending absorber materials 218 increase significantly electromagnetic paths between them.

Figure 4:
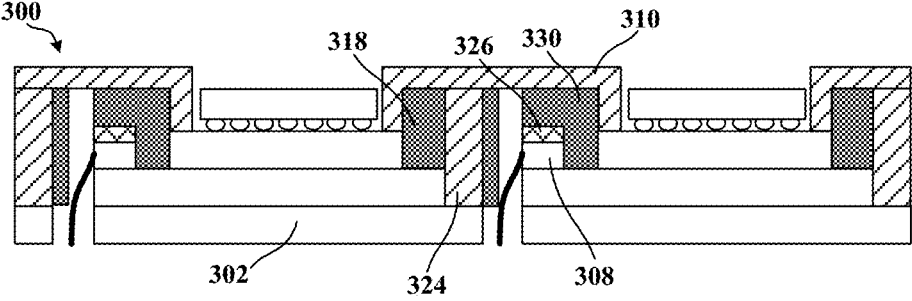
FIGS. 4 and 5 illustrate an apparatus for testing electronic devices according to another embodiment of the present application.

The electromagnetic absorber material can be attached to or filled in other positions of the test apparatus. FIG. 4 illustrates an apparatus 300 for testing electronic devices according to another embodiment of the present application.

As shown in FIG. 4, a base platform 302 and a cover plate 310 of the test apparatus 300 define an gap between two adjacent test chambers. Inside the gap, a support wall 324 stands between the cover plate 310 and the platform 302. A portion 318 of an electromagnetic absorber material is attached onto side surfaces of the support wall 324 for interference suppression. Furthermore, a connector 308 of a test board is disposed inside the gap. Another portion 330 of the electromagnetic absorber material is also disposed between the connector 308 and the cover plate 310. In some embodiments, the electromagnetic absorber material 318 can be attached onto a bottom surface of the cover plate 310 and an inner surface of the side wall of the cover plate 310. In some alternative embodiments, the electromagnetic absorber material 318 can be attached onto a top surface of the connector 308 and optionally a top surface of the test board. Preferably, a protection tape 326 may be mounted over the connector 308, and the electromagnetic absorber material 330 is attached onto the connector 308 via the protection tape 326. The protection tape 326 can protect the connector 308 from undesired damages by the electromagnetic absorber material 330, especially due to pressure applied by the electromagnetic absorber material 330 when the cover plate 310 is assembled with the base platform 302. The protection tape 326 can be formed of a material softer than the electromagnetic absorber material 330. As such, the portion of electromagnetic absorber material 330 provides improved insulation between the two adjacent test chambers.

Figure 5:
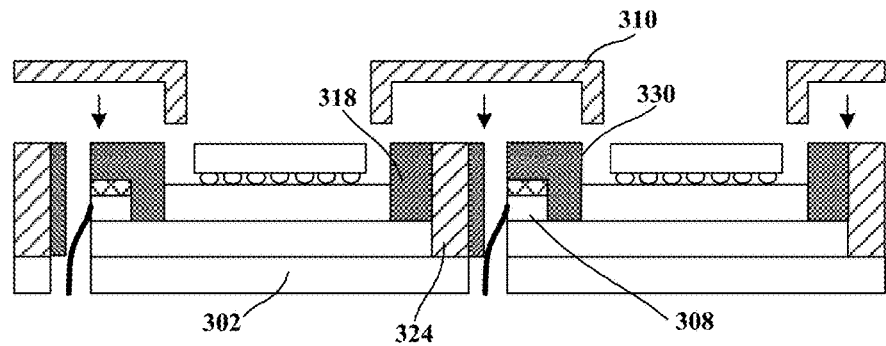

In some embodiments, the support wall 324 may be fixed with the base platform 302. For example, as shown in FIG. 5, the support wall 324 may be first assembled with the base platform 302, with the two portions of the electromagnetic absorber material 318 and 330 attached on the support wall 324 and the connector 308. Then the cover plate 310 can be loaded to and assembled with the base platform 302, with the support wall 324 standing between them.

Figure 6:
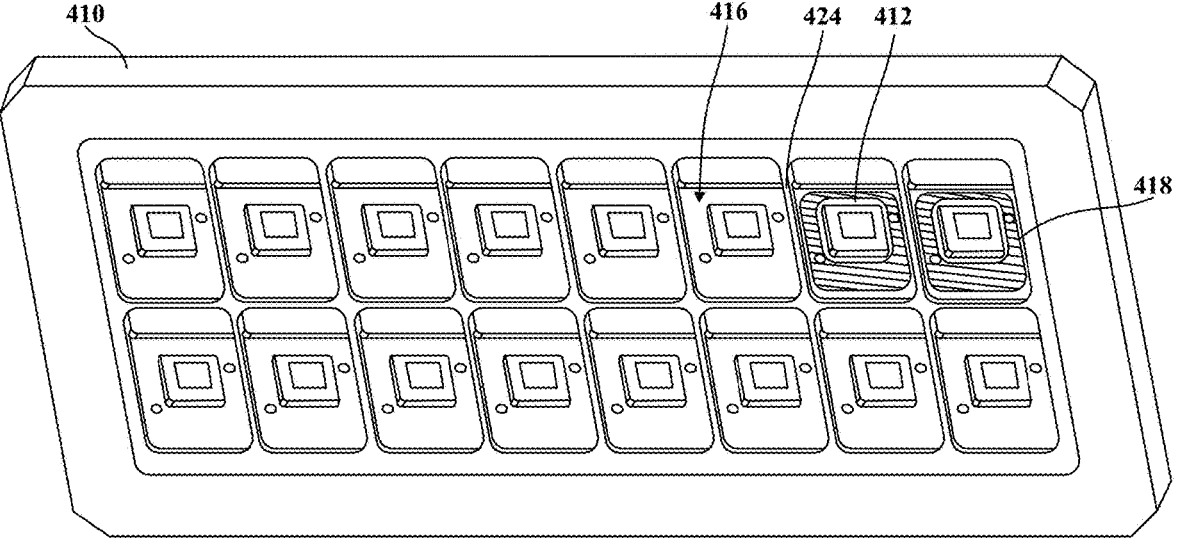
FIG. 6 illustrates a cover plate of an apparatus for testing electronic devices according to an embodiment of the present application.

In some alternative embodiments, the support wall 324 may be integrally formed with the cover plate 310, for example, be fixed with the cover plate 310 via fasteners, or be molded with the cover plate 310. FIG. 6 illustrates a bottom view of a cover plate 410 with support walls. As shown in FIG. 6, the cover plate 410 has a plurality of test chambers, each of which is enclosed by a side wall 412. Furthermore, the cover plate 410 includes a plurality of gaps 416, each of which encloses a corresponding side wall 412.

The gaps 416 are separated from each other by support walls 424. The support walls 414 are connected with each other as a support frame, and integrally formed with the cover plate 410. An electromagnetic absorber material 418 is attached onto a bottom surface of the cover plate 410 to fill in the space between the support wall 424 and the side wall 412, as shown in FIG. 6. In some embodiments, another top cover made of metal or similar conductive materials may be provided and assembled with the cover plate to cover the top openings of the cover plate, and thus, the test chambers for electronic devices can form generally confined spaces.

The test apparatus according to embodiments of the present application have been used in calibration and radiofrequency performance tests on electronic devices. According to the test results, the calibration and performance tests can be performed more reliably due to the reduction of interference between test sites. A test failure rate can be dramatically reduced from 10% (tests performed using conventional test apparatus) to less than 1.5%, which improves productivity of the electronic devices.

While the exemplary apparatus for testing electronic devices of the present application is described in conjunction with corresponding figures, it will be understood by those skilled in the art that modifications and adaptations to the method may be made without departing from the scope of the present invention.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. An apparatus for testing electronic devices, the apparatus comprising:

a base platform;

a cover plate disposed on the base platform, and defining with the base platform an array of test chambers and at least one gap separating the test chambers from each other, wherein the cover plate has at each of the test chambers a top opening for placing an electronic device within the test chamber and a side wall around the opening for separating the test chamber from the at least one gap;

an array of test boards each being disposed under one of the array of test chambers, wherein each test board includes a socket connectable with the electronic device placed within the test chamber for testing; and an electromagnetic absorber material disposed within the at least one gap and attached onto the cover plate to absorb electromagnetic interferences between adjacent electronic devices when they are placed within the array of test chambers for testing.

2. The apparatus of claim 1, wherein the electromagnetic absorber material is attached onto the side walls.

3. The apparatus of claim 1, wherein the cover plate has a main frame where the openings are formed, and the electromagnetic absorber material is attached onto the main frame.

4. The apparatus of claim 1, wherein the cover plate has a main frame where the openings are formed, at least one support wall extending between the main frame and the base platform, and the electromagnetic absorber material is attached onto the at least one support wall.

5. The apparatus of claim 4, wherein the electromagnetic absorber material is further attached onto the side walls.

6. The apparatus of claim 1, wherein each of the array of test boards further comprises a connector disposed within the at least one gap and electrically coupled with the socket, and wherein the connector is configured for connecting the socket with a host device for testing the electronic devices.

7. The apparatus of claim 1, wherein each of the array of test boards further comprises a protection tape mounted over a connector, and the electromagnetic absorber material is attached over the protection tape.

8. The apparatus of claim 1, wherein the electromagnetic absorber material is in a form of tapes.

9. The apparatus of claim 1, wherein the electromagnetic absorber material is a laminate of metal, electromagnetic absorber and adhesive layers.

* * * * *